(12) United States Patent
Nomiyama et al.

(10) Patent No.: US 11,311,944 B2
(45) Date of Patent: Apr. 26, 2022

(54) CUTTING INSERT

(71) Applicant: KYOCERA CORPORATION, Kyoto (JP)

(72) Inventors: Ryoma Nomiyama, Satsumasendai (JP); Junya Maegawa, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 839 days.

(21) Appl. No.: 16/079,583

(22) PCT Filed: Feb. 23, 2017

(86) PCT No.: PCT/JP2017/006760
§ 371 (c)(1),
(2) Date: Aug. 24, 2018

(87) PCT Pub. No.: WO2017/146131
PCT Pub. Date: Aug. 31, 2017

(65) Prior Publication Data
US 2019/0061011 A1 Feb. 28, 2019

(30) Foreign Application Priority Data
Feb. 24, 2016 (JP) .............................. JP2016-033285

(51) Int. Cl.
*B23B 27/14* (2006.01)
*C22C 1/05* (2006.01)
(Continued)

(52) U.S. Cl.
CPC .............. *B23B 27/14* (2013.01); *B22F 3/162* (2013.01); *B22F 5/00* (2013.01); *B23B 27/148* (2013.01);
(Continued)

(58) Field of Classification Search
CPC ....... B23B 27/14; B23B 2302/15; B22F 5/00; B22F 2005/001
(Continued)

(56) References Cited

U.S. PATENT DOCUMENTS

2007/0253787 A1\* 11/2007 Ishii ..................... B23B 27/141
407/113
2011/0129312 A1 6/2011 Kinoshita et al.
(Continued)

FOREIGN PATENT DOCUMENTS

JP  H09174306 A  7/1997
JP  2002126914 A  5/2002
(Continued)

*Primary Examiner* — Archene A Turner
(74) *Attorney, Agent, or Firm* — Viering, Jentschura & Partner mbB

(57) ABSTRACT

The cutting insert may include a substrate including a first surface, a second surface, and a cutting edge. The substrate may include a hard phase and a binder phase, and the hard phase may include a first hard phase and a second hard phase. In X-ray diffraction analysis, a peak of the first hard phase may be observed on a higher angle side than a peak of the second hard phase. The second hard phase in the second surface may include a compressive residual stress of 150 MPa or more. A maximum height (Rz) in the second surface may be 0.2 to 1.5 μm. A maximum height of the cutting edge may be 2 to 30 times the maximum height in the second surface.

6 Claims, 4 Drawing Sheets

(51) Int. Cl.
*C22C 29/04* (2006.01)
*B22F 3/16* (2006.01)
*B22F 5/00* (2006.01)
*B22F 3/10* (2006.01)
*B22F 7/00* (2006.01)

(52) U.S. Cl.
CPC ............... *C22C 1/05* (2013.01); *C22C 29/04* (2013.01); *B22F 3/10* (2013.01); *B22F 7/00* (2013.01); *B22F 2005/001* (2013.01); *B22F 2302/15* (2013.01); *B23B 2200/0471* (2013.01)

(58) Field of Classification Search
USPC ........................................................ 407/119
See application file for complete search history.

(56) References Cited

U.S. PATENT DOCUMENTS

2014/0227053 A1* 8/2014 Tokunaga ............... C22C 29/02
　　　　　　　　　　　　　　　　　　　　　　　　407/119
2016/0369380 A1* 12/2016 Kinoshita ............. B23B 27/148

FOREIGN PATENT DOCUMENTS

| JP | 2005007531 A | 1/2005 |
| JP | 2013078840 A | 5/2013 |

\* cited by examiner

CUTTING INSERT

CROSS-REFERENCE TO RELATED APPLICATIONS

This application is a national stage entry according to 35 U.S.C. 371 of PCT Application No. PCT/JP2017/006760 filed on Feb. 23, 2017, which claims priority to Japanese Application No. 2016-033285 filed on Feb. 24, 2016, which are entirely incorporated herein by reference.

TECHNICAL FIELD

The present disclosure relates to a cutting insert including a cermet.

BACKGROUND

Currently, a cermet containing titanium as a major component is widely used as a material of a cutting insert used for a cutting tool. Also, for example, Japanese Unexamined Patent Publication No. 2002-126914 (Patent Document 1) discloses a cutting insert in which the second surface is processed to have a surface roughness Ra of 0.08 μm or less and the cutting edge is sharpened.

However, although the cutting insert described in the Patent Document 1 has an effect of enhancing the sharpness of the cutting edge, the effect of smoothing the machined surface of a workpiece was insufficient.

SUMMARY

A cutting insert in one aspect includes a substrate including a first surface, a second surface adjacent to the first surface, and a cutting edge located at least at a part of an intersecting ridge portion of the first surface and the second surface. The substrate includes a hard phase containing titanium and a carbonitride including one or more kinds of metals selected from Groups 4, 5 and 6 in the periodic table and a binder phase containing at least one of cobalt and nickel, in which the hard phase includes a first hard phase and a second hard phase.

In addition, in X-ray diffraction analysis, a peak of the first hard phase is observed on a higher angle side than a peak of the second hard phase; the second hard phase in the second surface includes a compressive residual stress of 150 Mpa or more; a maximum height (Rz) in the second surface is 0.2 to 1.5 μm; and a maximum height of the cutting edge is 2 to 30 times the maximum height in the second surface.

DETAILED DESCRIPTION

Figure 1:
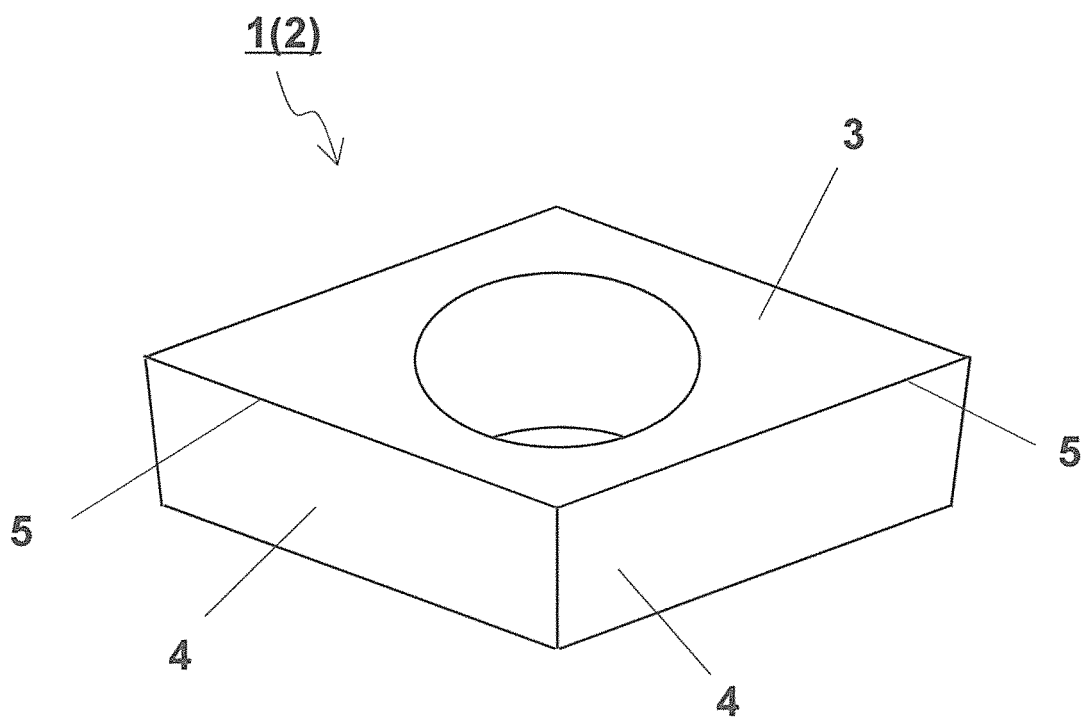
FIG. 1 is a schematic perspective view of a cutting insert.

The cutting insert according to a non-limiting embodiment will be described with reference to FIGS. 1 to 3.

A cutting insert (hereinafter referred to simply as an insert) 1 of the present non-limiting embodiment includes a polyhedral plate-shaped substrate 2. When the substrate 2 is not covered with a coating layer, the substrate 2 itself is the insert 1. As shown in FIG. 1, the substrate 2 includes a first surface 3, a second surface 4 adjacent to the first surface 3, and a cutting edge 5 located at least at a part of the intersecting ridge portion of the first surface 3 and the second surface 4. At least a part of the first surface 3 is a rake surface region and at least a part of the second surface 4 is a flank surface region.

Figure 2:
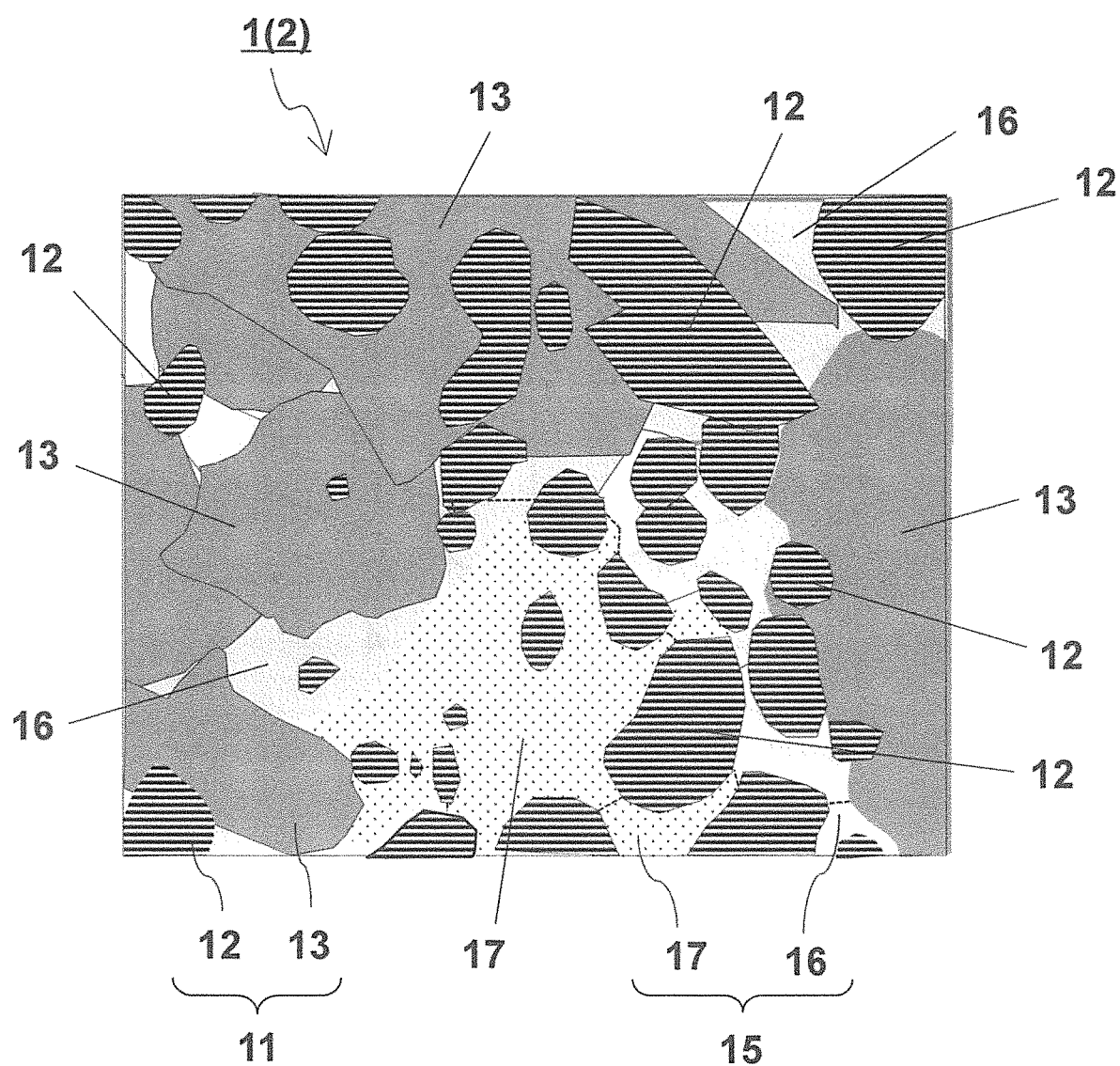
FIG. 2 is a schematic view for explaining one example of a structure of a cermet configuring a substrate in the cutting insert of FIG. 1.

As shown in FIG. 2, the substrate 2 of the present non-limiting embodiment is made of a cermet. The substrate 2 includes a hard phase 11 containing titanium and a carbonitride including one or more kinds of metals selected from Groups 4, 5 and 6 in the periodic table, and a binder phase 15 containing at least one of cobalt and nickel.

The hard phase 11 includes two phases different in composition from each other. Here, when the hard phase 11 is subjected to X-ray diffraction analysis and maximum peaks of the two phases are compared, a maximum peak of a first hard phase 12 is observed on a higher angle side than a maximum peak of a second hard phase 13. In other words, the maximum peak of the second hard phase 13 is observed on a lower angle side than the maximum peak of the first hard phase 12.

In the insert 1 of the present non-limiting embodiment, the second hard phase 13 on the second surface 4 includes a compressive residual stress of 150 Mpa or more and the second surface 4 includes a maximum height (Rz) of 0.2 to 1.5 μm. A maximum height of the cutting edge 5 is 2 to 30 times the maximum height in the second surface 4.

In this manner, as compared with the second surface 4, the unevenness of the cutting edge 5 is set to be relatively large, so that when the workpiece is subjected to cutting process with the insert 1, the unevenness of the cutting edge 5 is polished by the workpiece immediately after machining. Thus, the cutting edge 5 tends to have a configuration matching the shape of the machined surface of the workpiece. As a result, a smooth machined surface can be formed promptly after the start of the cutting process.

In addition, by setting the maximum height in the second surface 4 relatively small as compared with the cutting edge 5, the surface accuracy of the machined surface hardly deteriorates even when the second surface 4 comes into contact with the machined surface during cutting process.

In addition, since the second hard phase 13 includes a compressive residual stress of 150 MPa or more, degranulation of the second hard phase 13 is suppressed, and the cutting edge 5 can maintain a sharp state in which chipping hardly occurs. As a result, the machined surface roughness of the workpiece can be smoothed.

Figure 3:
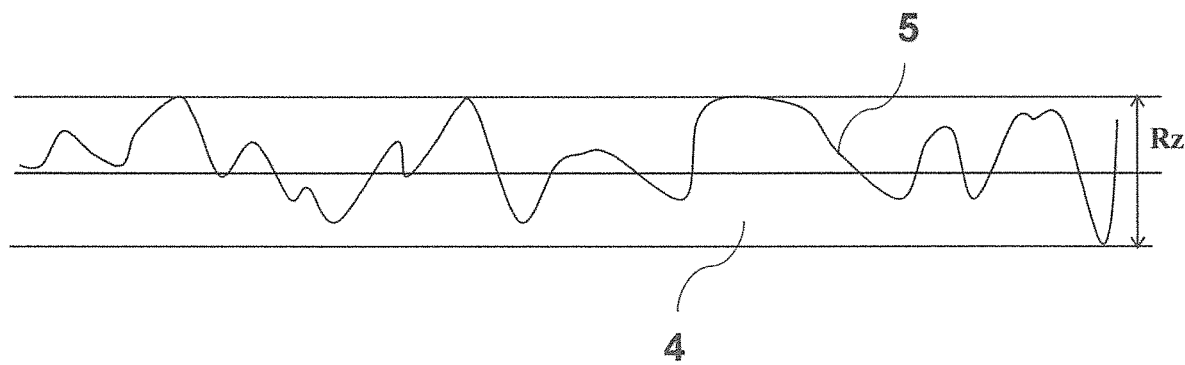
FIG. 3 is a schematic view showing a state in which the cutting edge in the cutting insert of FIG. 1 is observed.

In this non-limiting embodiment, the maximum height (Rz) of the cutting edge 5 is measured by placing the insert 1 in a direction in which the second surface 4 is a front face, observing the unevenness of the cutting edge 5 and recording the shape of the cutting edge 5 as shown in FIG. 3. Then, the maximum height (Rz) is calculated by subtracting a minimum value from a maximum value.

In addition, in the present non-limiting embodiment, in order to measure the maximum height (Rz) in the second surface 4, the surface shape of the second surface 4 may be measured in a direction parallel to the first surface 3 in accordance with the JIS B 0601-2001 standard except that the cutoff value is fixed to 0.08 mm. For the measurement, for example, a contact-type surface roughness tester using a stylus or a non-contact type surface roughness tester using a laser may be used.

Incidentally, when reading from the chart, the maximum height (Rz) may be calculated by subtracting the minimum value from the maximum value. Based on the measurement results, the shape of the second surface 4 is recorded in the same manner as in FIG. 3. Then, the maximum height (Rz) in the second surface 4 may be calculated.

It should be noted that the first surface 3 and the second surface 4 may be a sintered surface or a grinding surface. When the first surface 3 and the second surface 4 are grinding surfaces, it is easy to adjust the maximum height of these surfaces.

In addition, when a mass ratio (N/(C+N)) of a nitrogen content to a total content of carbon and nitrogen is 0.45 to 0.55, in which the carbon content is defined as C and the nitrogen content is defined as N, the wear resistance and fracture resistance of the substrate 2 are both high, so that chipping of the cutting edge 5 during cutting process can be suppressed.

The carbon content in the substrate 2 can be set to, for example, 6 to 6.5% by mass, and the nitrogen content can be set to, for example, 6.5 to 7.4% by mass. The content ratio of carbon and nitrogen in the substrate 2 can be measured by performing composition analysis by making a part of the structure in a region of 500 μm or more in depth from the surface of the substrate 2 into a powder.

An area ratio of the hard phase 11 and the binder phase 15 in a plan view of the substrate 2 in the present non-limiting embodiment can be set to, for example, 65 to 95% by area for the hard phase 11 and 5 to 35% by area for the binder phase 15. The area ratio of the hard phase 11 and the binder phase 15 can be calculated from the microscopic photograph of the substrate 2 by an image analysis method. When the hard phase 11 is 65 to 83% by area and the binder phase 15 is 17 to 35% by area, the rigidity and toughness of the substrate 2 can be made high.

Next, one example of the hard phase 11 will be described. The first hard phase 12 in the present non-limiting embodiment is composed of a TiCN phase. The second hard phase 13 in the present non-limiting embodiment is composed of titanium and a composite carbonitride of one or more kinds of metals (excluding titanium) selected from Groups 4, 5 and 6 in the periodic table.

In the case where the second surface 4 in the substrate 2 is observed, the second surface 4 may take a configuration in which the granular first hard phase 12 and the second hard phase 13 may be dispersed or may take a structure (cored structure phase) in which one hard phase is surrounded by the other hard phase. For example, a part of the first hard phase 12 may be surrounded by the second hard phase 13.

Further, although the hard phase 11 may be configured only by the first hard phase 12 and the second hard phase 13, the phases other than these phases may be slightly (about 10% or less with respect to the entire area of the hard phase 11) contained. Examples of the phases other than the first hard phase 12 and the second hard phase 13 include a phase not containing Ti and a phase including a carbide and a nitride of one or more kinds of metals selected from Groups 4, 5, and 6 in the periodic table.

A mean particle size d1 of the first hard phase 12 is, for example, 0.05 to 0.5 and a mean particle size d2 of the second hard phase 13 is, for example, 0.5 to 2 μm. When the particle size ratio (d2/d1) of the second hard phase 13 to the first hard phase 12 is 3 to 10, it is easy to control the maximum heights in the first surface 3 and the second surface 4 within a predetermined range by cutting process.

In addition, when d2/d1 is 3 to 10, degranulation of not only the second hard phase 13 but also the first hard phase 12 is easily suppressed since the mean particle size d2 of the second hard phase 13 is larger than the mean particle size d1 of the first hard phase 12.

When the area ratio of the first hard phase 12 in the microscopic observation is 20 to 35% by area as the area ratio with respect to the entire field of view and the area ratio of the second hard phase 13 is 35 to 50% by area as the area ratio with respect to the entire field of view, the fracture resistance can be enhanced while increasing the wear resistance of the substrate 2.

The binder phase 15 in the present non-limiting embodiment may contain tungsten in addition to at least one of cobalt and nickel. The binder phase 15 includes a first binder phase 16 and a second binder phase 17. In the binder phase 15, when a cobalt content is represented by Co, a nickel content is represented by Ni and a tungsten content is represented by W, a mass ratio (W/(Co+Ni)) of tungsten to a total amount of cobalt and nickel may be 0.8 or less, and the mass ratio W/(Co+Ni) of the second binder phase 17 may be 1.2 or more. The discrimination between the first binder phase 16 and the second binder phase 17 may be performed by confirming the distribution of each metal element by an electron probe micro analyzer (EPMA) or the like through microscopic observation of the substrate 2 and using the results of the ratio of the metal element at each position.

In the case where the binder phase 15 includes the first binder phase 16 and the second binder phase 17, since the heat dissipation property of the substrate 2 is high and the temperature of the cutting edge 5 hardly increases at the time of cutting, the wear resistance of the cutting edge 5 is improved. In addition, the second binder phase 17 has a higher elastic modulus than the composite carbonitride of tungsten and cobalt, and when impact is applied to the insert 1, such impact can be absorbed by elastic deformation of the second binder phase 17. Therefore, fracture resistance of the substrate 2 can be enhanced, and chipping caused in the cutting edge 5 during cutting can be suppressed.

In addition, since the first binder phase 16 has high wettability with the hard phase 11 and easily suppresses the progress of cracks, the fracture resistance of the insert 1 can be enhanced. The presence of the first binder phase 16 and the second binder phase 17 makes it easier to set the compressive residual stress of the second hard phase 13 on the second surface 4 to 150 MPa or more when machined under predetermined conditions as well as makes it easier to keep the unevenness of the cutting edge 5 within a predetermined range.

For the area ratio of each binder phase of the substrate 2 in the present non-limiting embodiment, for example, the area of the first binder phase 16 is 15 to 22% by area as the area ratio with respect to the entire field of view, the area of the second binder phase 17 is 2 to 20% by area as the area ratio with respect to the entire field of view, and the area ratio of the entire binder phase 15 including the first binder phase 16 and the second binder phase 17 is 17 to 35% by area.

The ratio of the area of the second binder phase 17 to the area of the first binder phase 16 ((the area of the second binder phase 17)/(the area of the first binder phase 16)) is not limited to a specific range, and if it is in the range of 0.1 to 2, both the wear resistance and the fracture resistance of the substrate 2 can be enhanced. In particular, when the ratio of the area of the second binder phase 17 to the area of the first binder phase 16 is 0.3 to 1.5, the wear resistance and fracture resistance of the substrate 2 can be further enhanced.

The binder phase 15 may include only the first binder phase 16 and the second binder phase 17 and may include phases other than these. FIG. 2 shows a configuration in which the binder phase 15 is configured only of the first binder phase 16 and the second binder phase 17, and no other phases are present. When the ratio of the area of the first binder phase 16 and the second binder phase 17 to the entire binder phase 15 is 0.9 or more, the heat dissipation property of the substrate 2 is stably increased, so that the wear resistance of the cutting edge 5 is stably improved.

As one example of the content of each metal element with respect to the total amount of the metals contained in the substrate 2, titanium is 30 to 55% by mass, tungsten is 10 to 30% by mass, niobium is 0 to 20% by mass, molybdenum is 0 to 10% by mass, tantalum is 0 to 10% by mass, vanadium is 0 to 5% by mass, zirconium is 0 to 5% by mass, cobalt is 5 to 25% by mass, and nickel is 0 to 15% by mass. If the content of each metal element is within the above range, the substrate 2 has high wear resistance and fracture resistance.

The compositions of the hard phase 11 and the binder phase 15 can be determined by checking the distribution state and content ratio of each element by an electron probe micro analyzer (EPMA) or Auger electron spectroscopy. The particle sizes of the first hard phase 12 and the second hard phase 13 can be measured according to the method of measuring the mean particle size of cemented carbide specified in CIS-019D-2005. In the case where the hard phase 11 has a structure in which a part of the first hard phase 12 is surrounded by the second hard phase 13, the particle size of the second hard phase 13 surrounding the first hard phase 12 may be calculated by considering the first hard phase 12 as a part of the second hard phase 13 as well.

As already indicated, since the second hard phase 13 on the second surface 4 includes a compressive residual stress of 150 MPa or more, degranulation of the second hard phase 13 is suppressed. At this time, when the first hard phase 12 on the second surface 4 includes a compressive residual stress of 30 to 145 MPa, degranulation of the first hard phase 12 in addition to degranulation of the second hard phase 13 is also suppressed, so that chipping of the cutting edge 5 due to the impact at the time of cutting is further suppressed.

In order to measure the residual stress of the hard phase 11, for example, such residual stress may be measured using the 2D method. Specifically, the portions located 1 mm or more away from the cutting edge 5 on the first surface 3 and the second surface 4 of the substrate 2 are taken as measurement positions, respectively. X-ray diffraction peaks are measured at these positions. In the measurement of the residual stress, the peak of the (422) plane in which the value of 2θ appears between 135 and 140 degrees is used as the X-ray diffraction peak.

At that time, the residual stresses of the first hard phase 12 and the second hard phase 13 are measured, respectively, while defining the peak $p_2$ (422) appearing on the low angle side as the peak attributed to the second hard phase 13, and the peak $p_1$ (422) appearing on the high angle side as the peak attributed to the first hard phase 12.

The numerical values necessary for calculation of the residual stress are calculated using Poisson's ratio of titanium nitride=0.2 and Young's modulus=423729 MPa. Further, as conditions for X-ray diffraction measurement, CuKα ray was used as a source of X-rays, and the output was 45 kV and 110 mA. The above-described X-rays were irradiated on the mirror-finished first surface 3 and the second surface 4 to measure the residual stress.

In the present non-limiting embodiment, since the maximum height in the second surface 4 is 0.2 to 1.5 μm, it is easy to control the maximum height of the cutting edge 5 within a predetermined range. Here, when the maximum height in the first surface 3 is 0.2 to 1 μm and the maximum height of the cutting edge 5 is 1.5 to 6 μm, it is easy to keep the cutting edge 5 in a sharp state during cutting. In particular, when the maximum height in the first surface 3 is smaller than the maximum height in the second surface 4, it is easy to control the unevenness of the cutting edge 5 within a predetermined range, and chips are less likely to be welded to the first surface 3 during cutting process.

When an arithmetic average roughness (Ra) of the first surface 3 is 0.03 to 0.1 μm, the machined surface is less likely to be dull due to less welding with chips. At this time, an arithmetic average roughness (Ra) of the second surface 4 can be set to, for example, 0.07 to 0.2 μm. The arithmetic average roughness (Ra) of the first surface 3 and the second surface 4 may be measured according to JIS B 0601-2001 standard except that the cutoff value is fixed to 0.08 mm.

In addition, when the second surface 4 includes a plurality of grooves extending in a direction parallel to the cutting edge 5, it is avoided that the maximum height of the cutting edge 5 becomes excessively large, and it is possible to make the surface roughness of the machined surface smoother. This is because when the second surface 4 includes a plurality of grooves, the contact area of the second surface 4 to the machined surface can be reduced. Further, in the case where a plurality of grooves extends in a direction parallel to the cutting edge 5, even if the second surface 4 is brought into contact with the machined surface, the shape of the groove is hardly transferred to the machined surface. Thus, the surface roughness of the machined surface becomes smoother. The depth of the groove may be set to, for example, about 0.2 to 1.5 μm.

In the cross section orthogonal to the first surface 3 and the second surface 4, when the cutting edge 5 includes a curvature radius of 10 μm or less, the shape of the cutting edge 5 can be made to match the machined surface more quickly, and the surface roughness of the machined surface can be made smoother. In addition, by making the cutting edge 5 sharp, it is easy to control the unevenness of the intersecting ridge portion including the cutting edge 5 within a predetermined range.

In the cross section orthogonal to the first surface 3 and the second surface 4, when the cutting edge 5 includes a curvature radius of 1 μm or more, it is avoided that the strength of the cutting edge 5 is excessively lowered. Therefore, chipping of the cutting edge 5 is easily avoided, for example, during storage or transportation of the insert 1.

The curvature radius of the cutting edge 5 may be measured with a three-dimensional shape measuring device in a surface region or a cross section where the first surface 3, the second surface 4 and the cutting edge 5 can be observed. Therefore, the curvature radius of the above-described cutting edge 5 is not necessarily evaluated in cross section.

Although the insert 1 described above includes only the substrate 2 made of cermet, the insert 1 may be provided not only with the substrate 2 but also with a coating layer positioned on the substrate 2 and covering the substrate 2. When the insert 1 is provided with only the substrate 2 made of cermet, occurrence of welding or the like on the machined surface of the workpiece can be suppressed, and a good machined surface can be obtained.

(Production Method)

Next, a method of producing the above-described insert 1 will be described.

First, a mixed powder was prepared by mixing TiCN powder having a mean particle size of 0.1 to 1.2 μm, particularly 0.3 to 0.9 μm, tungsten carbide (WC) powder having a mean particle size of 0.1 to 2.5 μm, at least one of carbide powder, nitride powder and carbonitride powder of metals of Groups 4 to 6 in the periodic table other than titanium carbonitride (TiCN) and WC, predetermined amounts of metal cobalt powder and metal nickel powder each having a mean particle size of 0.5 to 5 μm, 1 to 20% by mass of at least one of metal tungsten powder and $WC_{1-x}$ (0<x≤1) powder each having a mean particle size of 3 to 15 μm, and optionally carbon powder.

In the present non-limiting embodiment, as at least one of carbide powder, nitride powder and carbonitride powder of metals of Groups 4 to 6 in the periodic table, titanium nitride (TiN) powder, niobium carbide (NbC) powder, molybdenum carbide (MoC) powder, tantalum carbide (TaC) powder, vanadium carbide (VC) powder and zirconium carbide (ZrC) powder, each powder having a mean particle size of 0.1 to 3 μm, are applicable.

To prepare the mixed powder, a binder, a solvent and the like are added to the weighed raw material powder and mixed by a known mixing method such as a ball mill, a vibration mill, a jet mill and an attritor mill. In the present non-limiting embodiment, an attritor mill is adopted. By powder mixing with an attritor mill, the raw material powder is pulverized to reduce the particle size, but the metal powder tends to be difficult to be crushed because it has high ductility. Then, the mixed powder is formed into a predetermined shape by a known molding method such as press molding, extrusion molding and injection molding to prepare a molded body.

Next, according to the present non-limiting embodiment, the above molded body is sintered in a vacuum or an inert gas atmosphere. According to the present non-limiting embodiment, by sintering under the following conditions, the substrate 2 including the cermet of the predetermined structure described above can be produced. Specific sintering conditions include (a) raising the temperature from room temperature to 1100° C., (b) raising the temperature from 1100° C. to a first sintering temperature of 1330 to 1380° C. in a vacuum at a rate of temperature rise of 0.1 to 2° C./min, (C) raising the temperature from the first sintering temperature to a second sintering temperature of 1500 to 1600° C. at a rate of temperature rise of 4 to 15° C./min in a vacuum or in an inert gas atmosphere of 30 to 2000 Pa, (d) holding at a second sintering temperature for 0.5 to 2 hours in a vacuum or an inert gas atmosphere of 30 to 2000 Pa, and (e) decreasing the temperature at a temperature decreasing rate of 5 to 15° C./min in a nitrogen gas atmosphere of 1000 to 5000 Pa.

By adjusting the mean particle size of the WC powder and the metal W powder in the raw material powder and by controlling the temperature rising pattern at the time of sintering and the timing of introducing a predetermined amount of inert gas, the metal Co powder and the metal Ni powder dissolve while dissolving in each other as solid solution and wrap around the hard phase 11 to bond the hard phases 11 to each other. In addition, at least one of the metal W powder and the $WC_{1-x}$ (0<x≤1) powder existing in the molded body with the mean particle size larger than that of the other raw material powder diffuses partly into the hard phase 11 by sintering, but partly forms the second binder phase 17. Further, by adjusting the cooling pattern, predetermined residual stress can be imparted to the first hard phase 12 and the second hard phase 13. As a result, it is possible to produce the substrate 2 including the cermet of the above-mentioned structure.

Next, the surface of the obtained sintered body is polished. First, the sintered body is subjected to grinding process by interposing the sintered body between the grinding wheels so that the two faces of the first surface 3 and the surface located on the side opposite to the first surface 3 of the sintered body come into contact with the grinding wheels. Next, if desired, the breaker surface is machined using #1000 to #8000 grinding wheels so that the maximum height (Rz) in the first surface 3 is 0.2 to 1.0 μm. Then, the #400 to #800 grinding wheels are used for the second surface 4, which is the side surface of the substrate 2, and the grinding process is performed with the grinding wheel rotation speed of 500 to 5000 rpm and the work feed rate of 0.5 to 5 mm/minute. At this time, processing is carried out under processing conditions such that the maximum height Rz in the second surface 4 is 0.2 to 1.5 μm and the maximum height (Rz) in the first surface 3 is smoother than the maximum height (Rz) in the second surface 4.

If desired, a coating layer may be formed on the surface of the substrate 2. Physical vapor deposition (PVD) method such as ion plating method and sputtering method can be suitably applied as a method of forming the coating layer.

Next, a cutting tool 101 according to a non-limiting embodiment will be described with reference to the drawings.

Figure 4:
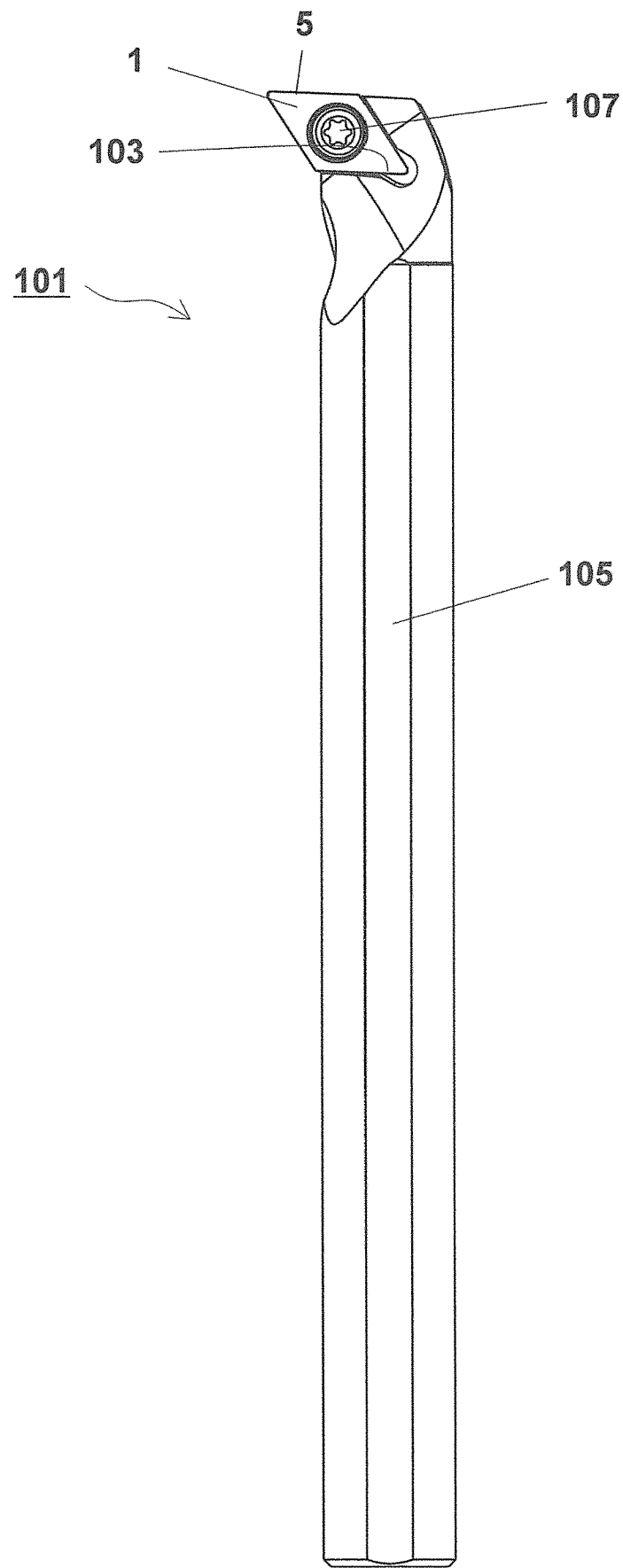
FIG. 4 is a top view showing a cutting tool.

As shown in FIG. 4, the cutting tool 101 of the present non-limiting embodiment is a rod-like body extending from the first end (the upper end in FIG. 4) toward the second end (the lower end in FIG. 4) and includes a holder 105 including a pocket 103 on the first end side and the above insert 1 located in the pocket 103.

The pocket 103 is a portion to which the insert 1 is mounted and includes a seating surface parallel to the lower surface of the holder 105 and a constraining side surface inclined with respect to the seating surface. Further, the pocket 103 opens at the first end side of the holder 105.

In the pocket 103, the insert 1 is located. At this time, the lower surface of the insert 1 may be in direct contact with the pocket 103, or a sheet may be interposed between the insert 1 and the pocket 103.

The insert 1 is mounted so that the portion used as the cutting edge 5 at the intersecting ridge portion projects outward from the holder 105. In the present non-limiting embodiment, the insert 1 is attached to the holder 105 by a fixing screw 107. That is, by inserting the fixing screw 107 into the through hole of the insert 1 and then inserting the tip of the fixing screw 107 into the screw hole (not shown) formed in the pocket 103, the threaded portions are screwed together, whereby the insert 1 is attached to the holder 105.

As the holder 105, steel, cast iron or the like can be used. In particular, a steel having high toughness among these members may be used in a non-limiting embodiment.

In the present non-limiting embodiment, a cutting tool used for so-called turning process is exemplified. Examples of the turning process include internal process, external process, and grooving process. The cutting tool is not limited to those used for turning process. For example, the insert 1 of the above non-limiting embodiment may be used for a cutting tool used for milling process.

EXAMPLE 1

TiCN powder having a mean particle size of 0.6 μm as measured by Microtrac method, WC powder having a mean particle size of 1.1 μm, TiN powder having a mean particle size of 1.5 μm, TaC powder having a mean particle size of 2 μm, NbC powder having a mean particle size of 1.5 μm, MoC powder having a mean particle size of 2 μm, ZrC powder having a mean particle size of 1.8 μm, VC powder having a mean particle size of 1 μm, Ni powder having a mean particle size of 2.4 μm, and Co powder having a mean particle size of 1.9 μm, and W powder or $WC_{0.5}$ powder were adjusted at the ratios shown in Table 1 to prepare a mixed powder.

Isopropyl alcohol (IPA) and paraffin were added to the mixed powder, and a stainless-steel ball mill and a cemented carbide ball were added thereto. The mixture was mixed in an attritor mill to prepare a slurry. The slurry was granulated by spray drying to prepare granulated powder, which was then press-molded into a square plate shape at 150 MPa.

Then, sintering of the press-molded product obtained above was carried out under the following sintering conditions: (a) raising the temperature from room temperature to 1100° C., (b) raising the temperature from 1100° C. to a first sintering temperature of 1350° C. in a vacuum at a rate of temperature rise of 0.7° C./min, (c) raising the temperature from 1350° C. to a second sintering temperature shown in Table 1 at a rate of temperature rise of 10° C./min in a nitrogen gas atmosphere of 1000 Pa, (d) holding at the second sintering temperature for 1 hour in a nitrogen gas atmosphere of 1000 Pa, and (e) decreasing the temperature at a temperature decreasing rate and a pressure shown in Table 1 in a nitrogen gas atmosphere.

structure phase is present in a proportion of 10% by area or less with respect to the entire hard phase.

Hereinafter, the ratio of the area of the first hard phase to the entire field of view is defined as S1, the ratio of the area of the second hard phase to the entire field of view is defined as S2, the ratio of the area of the first binder phase to the entire field of view is defined as s1, and the ratio of the area of the second binder phase to the entire field of view is defined as s2.

Image analysis was performed in the region of 2500 nm×2000 nm using a commercially available image analysis software, and the area ratio in the field of view of the area ratio s1 of the first binder phase, the area ratio s2 of the second binder phase and the area ratio of the other binder phase (described as "others" in the table) were confirmed to represent the ratio s2/s1. Further, the area ratio of the sum of s1 and s2 to the total binder phases (described as s1+s2 ratio in the table) was calculated.

Regarding the hard phase, the mean particle size (d1, d2) of the first hard phase and the second hard phase and the ratio d2/d1 thereof, the area ratio S1 of the first hard phase in the field of view, and the area ratio S2 of the second hard phase were measured. The results are shown in Table 4.

Further, the maximum height and the arithmetic average roughness of the first surface, the second surface, and the cutting edge were measured. The residual stresses of the first

TABLE 1

| | Raw material composition (% by mass) | | | | | | | | | | | W or $WC_{0.5}$ | | Sintering condition | | |
|---|---|---|---|---|---|---|---|---|---|---|---|---|---|---|---|---|
| Sample No. | TiCN | WC | TiN | TaC | MoC | NbC | ZrC | VC | MnC | Ni | Co | Type | Mean particle size (μm) | % by mass | Second sintering temperature (° C.) | Temperature decreasing rate (° C./ minutes) | Pressure (Pa) |
| I-1 | 35 | 15 | 11 | 0 | 0 | 11 | 1 | 1 | 0 | 10 | 10 | W | 7 | 6 | 1575 | 10 | 3000 |
| I-2 | 33 | 9 | 9 | 2 | 2 | 10 | 1 | 0 | 0 | 10 | 15 | W | 8 | 9 | 1550 | 11 | 3000 |
| I-3 | 50 | 8 | 12 | 1 | 0 | 9 | 2 | 1 | 0 | 8 | 8 | $WC_{0.5}$ | 3 | 1 | 1550 | 15 | 3000 |
| I-4 | 43 | 13 | 11 | 0 | 0 | 11 | 0.5 | 1.5 | 0 | 10 | 10 | | — | | 1575 | 10 | 3000 |
| I-5 | 43 | 13 | 10 | 1 | 1 | 9 | 1 | 1 | 0 | 8 | 10 | W | 6 | 3 | 1650 | 12 | 3000 |
| I-6 | 43 | 13 | 10 | 1 | 1 | 9 | 1 | 1 | 0 | 8 | 10 | W | 6 | 3 | 1575 | 10 | 100 |

Then, after machining the first surface with a grinding wheel #1000 at a grinding wheel rotation speed of 2000 rpm and at a work feed rate of 3 mm/min, the second surface was ground with a grinding wheel #500 under machining conditions of a grinding wheel rotation speed of 2000 rpm and a work feed rate of 2 mm/min, thereby to obtain an insert including a cutting-edge radius of curvature of 5 μm.

With regard to the obtained insert, the composition of the metal elements contained in the substrate was analyzed by ICP analysis, and the content of each metal element with respect to the total amount of the metal elements was calculated. Using the carbon analyzer, the carbon content of the center side portion polished by 500 μm or more from the surface of the substrate was also measured with a cermet having a known carbon content as a standard sample. The results are shown in Table 2.

Observation with a transmission electron microscope (TEM) was carried out to check the structure of arbitrary five portions, and the type of hard phase and binder phase was specified with an electron probe micro analyzer (EPMA) using a photograph at 50000 magnification, thereby to confirm the presence or absence of the first hard phase, the second hard phase, the first binder phase and the second binder phase. In each sample, it was found that the cored hard phase and the second hard phase on the first surface and the second surface were also measured by the 2D method. In addition, on the second surface, presence or absence, and direction of grooves were confirmed using a microscope.

Subsequently, turning tests were conducted using the obtained inserts under the following cutting conditions. The results are shown together in Table 5.

(Finished Surface Evaluation)
Workpiece: S10C
Cutting speed: 50 m/min
Feed rate: 0.07 mm/rev
Cut: 0.5 mm
Cutting state: Wet type
Evaluation method: After machining for 30 seconds, the arithmetic average roughness and the degree of dullness of the machined surface of the workpiece were confirmed.

(Life Evaluation)
Workpiece: SCM 435
Cutting speed: 250 m/min
Feed rate: 0.12 mm/rev
Cut: 0.5 mm
Cutting state: Wet type
Evaluation method: The cutting length that reached the end of life was measured.

TABLE 2

| Sample No. | Cermet composition (% by mass) | | | | | | | | | | Carbon content (% by mass) | Nitrogen content (% by mass) | N/(C + N) |
|---|---|---|---|---|---|---|---|---|---|---|---|---|---|
| | Content of metal element | | | | | | | | | | | | |
| | Ti | W | Ta | Mo | Nb | Zr | V | Mn | Ni | Co | | | |
| I-1 | Residue | 24.3 | 0 | 0 | 11.8 | 1.1 | 1 | 0 | 12.1 | 12.1 | 6.15 | 6.43 | 0.51 |
| I-2 | Residue | 20.7 | 2.2 | 2.1 | 10.5 | 1 | 0 | 0 | 11.9 | 17.8 | 6.1 | 6.01 | 0.5 |
| I-3 | Residue | 10.9 | 1.2 | 0 | 10.3 | 2.3 | 1 | 0 | 10.3 | 10.3 | 6.5 | 5.91 | 0.48 |
| I-4 | Residue | 15.3 | 0 | 0 | 12.2 | 0.6 | 1.5 | 0 | 12.5 | 12.5 | 6.7 | 6.38 | 0.49 |
| I-5 | Residue | 18.9 | 1.2 | 1.1 | 9.9 | 1.1 | 1 | 0 | 10 | 12.5 | 6.2 | 4.56 | 0.42 |
| I-6 | Residue | 18.9 | 1.2 | 1.1 | 9.9 | 1.1 | 1 | 0 | 10 | 12.5 | 6.2 | 4.56 | 0.42 |

TABLE 3

| Sample No. | Cermet | | | | | | Mean area of binder phase ($\mu m^2$, ratio) | | |
|---|---|---|---|---|---|---|---|---|---|
| | First binder phase | | | Second binder phase | | | | | |
| | W | Co + Ni | W/(Co + Ni) | W | Co + Ni | W/(Co + Ni) | s1 | s2 | s2/s1 |
| I-1 | 13.5 | 79.1 | 0.17 | 55.2 | 34.2 | 1.61 | 0.07 | 0.1 | 1.43 |
| I-2 | 12.2 | 78.7 | 0.16 | 55.3 | 36.1 | 1.53 | 0.06 | 0.1 | 1.67 |
| I-3 | 38.7 | 50.5 | 0.77 | 60.8 | 30 | 2.03 | 0.06 | 0.06 | 1 |
| I-4 | 15.3 | 73.8 | 0.21 | — | — | — | — | — | — |
| I-5 | 16.2 | 74.1 | 0.22 | — | — | — | — | — | — |
| I-6 | 12.2 | 78.7 | 0.16 | 55.3 | 36.1 | 1.53 | 0.06 | 0.1 | 1.67 |

TABLE 4

| Sample No. | Cermet | | | | | Hard phase | | | | | | |
|---|---|---|---|---|---|---|---|---|---|---|---|---|
| | Total area of binder phase (% by area, ratio) | | | | | | | | S1 | S2 | First hard phase σ11 | Second hard phase σ11 |
| | s1 | s2 | others | s2/s1 | ratio of s1 + s2 | d1 (μm) | d2 (μm) | d2/d1 | (% by area) | (% by area) | | |
| I-1 | 20 | 9 | 2 | 0.45 | 0.94 | 0.43 | 1.8 | 4.19 | 25 | 44 | −150 | −207 |
| I-2 | 17 | 18 | 2 | 1.06 | 0.95 | 0.34 | 1.35 | 3.97 | 22 | 41 | −25 | −157 |
| I-3 | 17 | 2 | 2 | 0.12 | 0.9 | 0.4 | 1.19 | 2.98 | 32 | 46 | −79 | −185 |
| I-4 | 25 | — | 3 | — | — | 0.45 | 1.8 | 4 | 25 | 47 | −165 | −192 |
| I-5 | 20 | — | 4 | — | — | 0.65 | 2.52 | 3.88 | 18 | 58 | −100 | −100 |
| I-6 | 17 | 18 | 2 | 1.06 | 0.95 | 0.34 | 1.35 | 3.97 | 22 | 41 | −100 | −120 |

TABLE 5

| Sample No. | Cermet | | | | | | Machined surface | | |
|---|---|---|---|---|---|---|---|---|---|
| | Maximum height (μm) | | | | Arithmetic average roughness (μm) | | Machined surface | | |
| | First surface | Second surface | Cutting edge | Second surface | First surface | Second surface | Surface roughness (μm) | Dullness | Cutting edge/ Cutting length (km) |
| I-1 | 0.6 | 1.5 | 3.1 | 2.1 | 0.06 | 0.09 | 0.58 | Absent | 13.6 |
| I-2 | 0.2 | 0.2 | 5.8 | 29 | 0.03 | 0.12 | 0.49 | Absent | 12.8 |
| I-3 | 0.4 | 0.5 | 2.7 | 5.4 | 0.09 | 0.07 | 0.53 | Absent | 14.5 |
| I-4 | 0.8 | 1.2 | 1.8 | 1.5 | 0.16 | 0.19 | 0.83 | Absent | 8.1 |

TABLE 5-continued

| | Cermet | | | | | | | |
|---|---|---|---|---|---|---|---|---|
| | Maximum height (μm) | | | | Arithmetic average roughness (μm) | | Machined surface | |
| Sample No. | First surface | Second surface | Cutting edge | Cutting edge/ Second surface | First surface | Second surface | Machined surface Surface roughness (μm) | Dullness | Cutting length (km) |
| I-5 | 0.5 | 0.6 | 4.2 | 7 | 0.12 | 0.16 | 0.79 | Absent | 7.2 |
| I-6 | 0.2 | 0.2 | 7.2 | 36 | 0.04 | 0.06 | 1.08 | Present | 6.5 |

According to Tables 1 to 5, in each of sample Nos. I-1 to I-3 in which the maximum height of the cutting edge is 2 to 30 times the maximum height in the second surface and the second hard phase on the second surface includes a compressive residual stress of 150 MPa or more, the surface roughness of the machined surface was all smooth in the samples, there was no dullness on the machined surface, and the cutting length was long.

In particular, in the sample Nos. I-2 and I-3 in which the compressive residual stress of the first hard phase on the second surface is in the range of 30 to 145 MPa, since the chipping of the cutting edge was suppressed, the surface roughness of the machined surface had a particularly excellent value.

In addition, in sample Nos. I-1 and I-3 in which the maximum height in the first surface is smaller than the maximum height in the second surface, it was difficult for the chips to be welded to the first surface during cutting process, so it was possible to perform stable cutting and the cutting length was particularly long.

EXAMPLE 2

Using sample No. 1 of Example 1, the cutting method was changed to the grinding method shown in Table 6 to prepare a cutting edge. With respect to the obtained insert, the maximum height and the arithmetic average roughness, the residual stress of the first hard phase and the second hard phase, and the presence or absence and the direction of the groove on the second surface were measured in the same manner as in Example 1. Further, the cutting performance was evaluated under the same cutting conditions as in Example 1.

TABLE 7

| | Machined surface | | |
|---|---|---|---|
| Sample No. | Surface roughness (μm) | Dullness | Cutting length (km) |
| II-1 | 1.5 | Absent | 30 |
| II-2 | 2.2 | Absent | 28 |
| II-3 | 2.6 | Absent | 25 |
| II-4 | 3 | Absent | 20 |
| II-5 | 10 | Present | 10 |
| II-6 | 5 | Present | 18 |

According to Tables 6 to 7, in each of sample Nos. II-1 to II-3 in which the maximum height of the cutting edge is 2 to 30 times the maximum height in the second surface, and the second hard phase on the second surface includes a compressive residual stress of 150 MPa or more, the surface roughness of the machined surface was all smooth in the samples, there was no dullness on the machined surface, and the cutting length was long.

In sample Nos. II-1 and II-2 in which the second surface has a plurality of grooves extending in a direction parallel to the cutting edge, the shape of the groove is difficult to be transferred to the machined surface, so that the surface roughness of the machined surface and the cutting length were excellent in values.

In sample No. II-1 in which the maximum height in the first surface is smaller than the maximum height in the second surface, it was difficult for the chips to be welded to the first surface during cutting process, so it was possible to perform stable cutting, and the surface roughness and the cutting length of the machined surface were particularly excellent in values.

TABLE 6

| | Insert | | | | | | | | | | |
|---|---|---|---|---|---|---|---|---|---|---|---|
| | Grinding method | | | Residual stress σ11 | | Maximum height (μm) | | | | Arithmetic average roughness (μm) | |
| | Grinding wheel | | Direction of | First | Second | | | | Cutting | | |
| Sample No. | First surface | Second surface | groove to cutting edge | hard phase | hard phase | First surface | Second surface | Cutting edge | edge/Second surface | First surface | Second surface |
| II-1 | #1500 | #400 | Parallel | −60 | −225 | 0.6 | 1.5 | 3 | 2 | 0.06 | 0.1 |
| II-2 | #6000 | #600 | Parallel | −56 | −165 | 0.3 | 0.2 | 5.9 | 29.5 | 0.04 | 0.11 |
| II-3 | #2000 | #500 | Perpendicular | −89 | −180 | 0.5 | 0.5 | 2.9 | 5.8 | 0.08 | 0.08 |
| II-4 | #1000 | #400 | Parallel | −95 | −162 | 0.7 | 1.2 | 1.8 | 1.5 | 0.12 | 0.2 |
| II-5 | #2000 | #800 | Parallel | −105 | −183 | 0.5 | 0.6 | 4.2 | 7 | 0.1 | 0.16 |
| II-6 | #8000 | #2000 | Parallel | −89 | −120 | 0.2 | 0.2 | 7.2 | 36.0 | 0.03 | 0.06 |

Additional advantages and modifications will readily occur to those skilled in the art. Therefore, the invention in its broader aspects is not limited to the specific details and representative embodiments shown and described herein. One skilled in the art would recognize that various features in the disclosure are not necessarily mutually exclusive, as some aspects of the disclosure may be combined with one or more other embodiments and aspects of the disclosure. Accordingly, various modifications may be made without departing from the spirit or scope of the general inventive concept as defined by the appended claims and their equivalents.

DESCRIPTION OF THE REFERENCE NUMERALS

1: Cutting insert (insert)
2: Substrate
3: First surface
4: Second surface
5: Cutting edge
11: Hard phase
12: First hard phase
13: Second hard phase
15: Binder phase
16: First binder phase
17: Second binder phase
101: Cutting tool
103: Pocket
105: Holder
107: Fixing screw

What is claimed is:

1. A cutting insert, comprising:
a substrate comprising a first surface that is a rake surface, a second surface that is a flank surface adjacent to the first surface, and
a cutting edge located at least at a part of an intersecting ridge portion of the first surface and the second surface, wherein
the substrate comprises a hard phase; the hard phase comprising titanium and a carbonitride selected from the group consisting of one or more metals from Groups 4, 5, and 6 in the periodic table; and a binder phase comprising at least one of cobalt and nickel;
the hard phase comprises a first hard phase and a second hard phase;
a peak of the first hard phase is observed on a higher angle side than a peak of the second hard phase in X-ray diffraction analysis;
the second hard phase in the second surface comprises a compressive residual stress of 150 MPa or more;
a maximum height (Rz) in the first surface is 0.2 to 1 μm;
a maximum height (Rz) in the second surface is 0.2 to 1.5 μm;
the maximum height (Rz) in the first surface is less than the maximum height (Rz) in the second surface; and
a maximum height (Rz) of the cutting edge is 2.0 to 6.0 μm, which is 2 to 30 times the maximum height (Rz) in the second surface.

2. The cutting insert according to claim 1, wherein a mass ratio (N/(C+N)) of a nitrogen content to a total content of carbon and nitrogen in the substrate is 0.45 to 0.55.

3. The cutting insert according to claim 1, wherein the first hard phase on the second surface comprises a compressive residual stress of 30 to 145 MPa.

4. The cutting insert according to claim 1, wherein the second surface comprises a plurality of grooves extending in a direction parallel to the cutting edge.

5. The cutting insert according to claim 1, wherein the cutting edge comprises a curvature radius of 1 to 10 μm in a cross section orthogonal to the intersecting ridge portion.

6. A cutting tool, comprising:
a holder comprising a pocket at a tip side of the holder; and
the cutting insert according to claim 1 which is located at the pocket.

* * * * *